(12) United States Patent
Romano et al.

(10) Patent No.: US 10,454,469 B2
(45) Date of Patent: Oct. 22, 2019

(54) SWITCH DEVICE AND METHOD

(71) Applicant: Infineon Technologies AG, Neubiberg (DE)

(72) Inventors: Francesca Romano, Villach (AT); Alexander Mayer, Treffen (AT); Luca Petruzzi, Goedersdorf (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/840,194

(22) Filed: Dec. 13, 2017

(65) Prior Publication Data

US 2018/0175855 A1 Jun. 21, 2018

(30) Foreign Application Priority Data

Dec. 16, 2016 (DE) .................. 10 2016 124 611

(51) Int. Cl.
| | | |
|---|---|---|
| *H03K 17/18* | (2006.01) | |
| *H03K 17/30* | (2006.01) | |
| *H03K 17/16* | (2006.01) | |
| *H03K 17/081* | (2006.01) | |

(52) U.S. Cl.
CPC ......... *H03K 17/302* (2013.01); *H03K 17/166* (2013.01); *H03K 17/18* (2013.01); *H03K 17/30* (2013.01); *H03K 17/08104* (2013.01); *H03K 17/08112* (2013.01)

(58) Field of Classification Search
CPC ....... H03K 17/08104; H03K 17/08112; H03K 17/166; H03K 17/18; H03K 17/30; H03K 17/302

USPC ........ 327/108, 109, 419, 427, 434, 574, 581
See application file for complete search history.

(56) References Cited

U.S. PATENT DOCUMENTS

| 7,166,992 | B2 * | 1/2007 | Kudo | ................. | H02M 3/1588 |
| | | | | | 323/282 |
| 7,821,236 | B2 * | 10/2010 | Hasegawa | ........... | H02M 3/1588 |
| | | | | | 323/222 |
| 8,400,129 | B2 * | 3/2013 | Ouyang | ................ | H02M 3/158 |
| | | | | | 323/271 |
| 2004/0178809 | A1 * | 9/2004 | Fujino | ................... | H02M 7/537 |
| | | | | | 324/710 |
| 2009/0295350 | A1 * | 12/2009 | Yamada | .............. | H02M 3/1588 |
| | | | | | 323/282 |
| 2014/0146238 | A1 * | 5/2014 | Murakami | .......... | H02M 3/1563 |
| | | | | | 348/730 |

(Continued)

FOREIGN PATENT DOCUMENTS

DE 19606100 A1 8/1997

*Primary Examiner* — William Hernandez
(74) *Attorney, Agent, or Firm* — Slater Matsil, LLP

(57) ABSTRACT

An embodiment method includes detecting an inverse current condition at a switch, and driving a node associated with a switch driver driving the switch to a predetermined voltage in response to the detection of an inverse current condition at the switch. An embodiment switch device includes a switch driver configured to be coupled to a control terminal of a switch, an inverse current detector configured to detect an inverse current condition at the first and second load terminals of the switch, and a voltage driver configured to drive a node associated with the switch driver to a predetermined voltage in response to the inverse current detector detecting an inverse current condition.

24 Claims, 8 Drawing Sheets

(56) References Cited

U.S. PATENT DOCUMENTS

2016/0065102 A1* 3/2016 Sicard ............... H03K 17/18
                                                318/400.27

\* cited by examiner

SWITCH DEVICE AND METHOD

This application claims the priority to German Application No. 102016124611.5, filed on Dec. 16, 2016, which application is hereby incorporated herein by reference in its entirety.

TECHNICAL FIELD

The present application relates to switch devices and to methods for operating switch devices.

BACKGROUND

Power switches are conventionally used to couple a load with a supply voltage. In recent years, "smart" power switch devices have been developed which are equipped with one or more diagnostic abilities and protection features, for example against overloads and short circuit events. In some implementations, in a power switch device a MOS transistor may be used as a power switch selectively coupling a load to a supply voltage. Such power switches are for example used in modern automotive and industrial systems instead of conventional fuses and electromechanical switches for low voltage applications with medium to high current loads. In such applications, a first load terminal (also referred to as input terminal) of the power switch device is coupled to a supply voltage, and a second load terminal (also referred to as output terminal) of the power switch device is coupled to a load to be supplied with power. In such configurations, a so-called inverse current condition may occur, where a voltage at the second load terminal (output terminal) is higher than a voltage at the first load terminal (input terminal). Due to parasitic bipolar transistors becoming conducting in such a situation, it may be impossible to turn the power switch device on, which, however, may be desirable for some applications.

In this respect, a conventional power switch device is disclosed in DE 196 06 100 A1.

SUMMARY

According to an embodiment, a switch device is provided, comprising: a switch comprising a control terminal, a first load terminal and a second load terminal, a switch driver coupled to the control terminal of the switch, an inverse current detector configured to detect an inverse current condition at the first and second load terminals of the switch, and a voltage driver configured to drive a node associated with the switch driver to a predetermined voltage in response to the inverse current detector detecting an inverse current condition.

According to another embodiment, a method is provided, comprising: detecting an inverse current condition at a switch, and driving a node associated with a switch driver driving the switch to a predetermined voltage in response to the detection of an inverse current condition at the switch.

According to a further embodiment, switch control circuit includes a driver having an output terminal configured to be coupled to a control terminal of a switching transistor; a first switch having a first terminal coupled to a reference terminal of the driver and a second terminal configured to be coupled to a first load terminal of the switching transistor; a second switch coupled between a power supply terminal and the reference terminal of the driver; and an inverse current detector having an output coupled to control terminals of the first switch and the second switch, and an input configured to be coupled to the switching transistor. The inverse current detector is configured to detect an inverse current condition of the switching transistor, open the first switch and close the second switch when the inverse current condition is detected, and close the first switch and open the second switch when the inverse current condition is not detected.

The above summary is merely intended to give a brief overview over some aspects of some embodiments and is not to be construed as limiting. In particular, other embodiments may have different features, components or elements than the ones discussed above.

DETAILED DESCRIPTION OF ILLUSTRATIVE EMBODIMENTS

Figure 1:
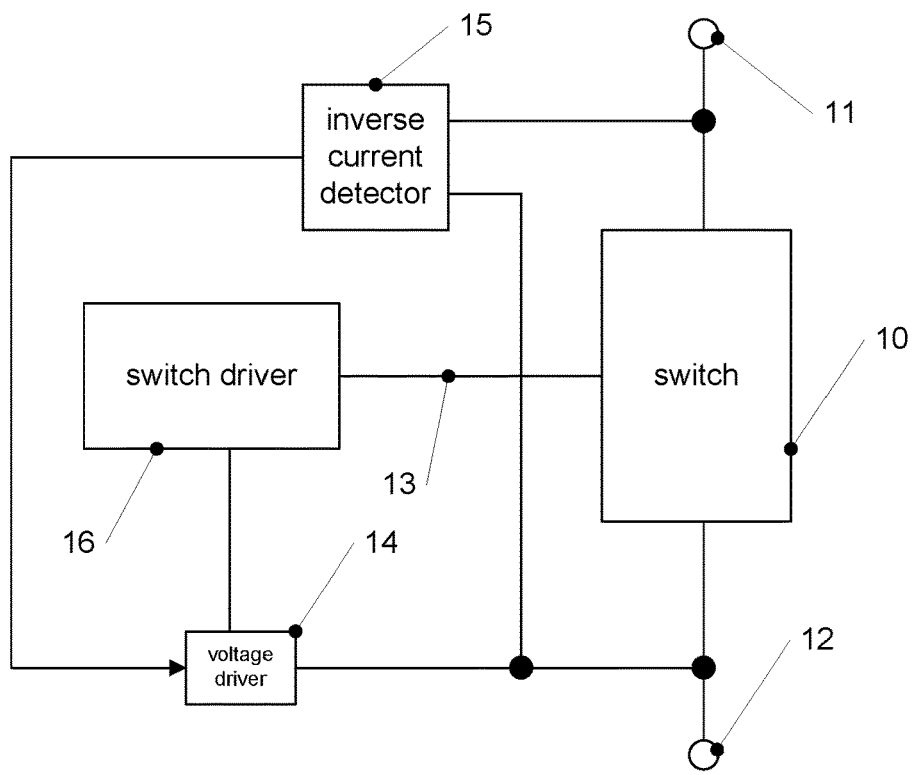
FIG. 1 is a diagram illustrating a switch device according to an embodiment.

In the following, various embodiments will be described in detail with reference to the attached drawings. It has to be noted that these embodiments serve as illustrative examples only and are not to be construed as limiting the scope of the present application. For example, while an embodiment may be described as comprising a plurality of features or elements, this serves illustration purposes only, and in other embodiments some of these features or elements may be omitted and/or be replaced by alternative features or elements. Furthermore, in some embodiments, features or elements in addition to those described herein or shown in the drawings may be provided, for example features or elements conventionally used in power switches, without departing from the scope of the present application. Features or elements from different embodiments may be combined with each other to form further embodiments. Variations or modifications described with respect to one of the embodiments may also be applied to other embodiments.

Any direct electrical connections or couplings shown in the drawings or described herein, i.e. connections or couplings without intervening elements, may also be implemented as indirect connections or couplings, i.e. connections or couplings with one or more additional intervening elements, and vice versa, as long as the general function of the connection or coupling, for example to transmit a certain kind of information or signal or to provide a certain kind of control, is essentially maintained. Connections or couplings may be implemented as wire based connections or couplings or as wireless connections or couplings, or mixtures thereof.

Generally, in the context of the present application switches like power switches may be described as comprising one or more control terminals and two or more load terminals. An opening and closing of the power switch may be controlled by applying one or more signals to at least one of the one or more control terminals. When the power switch is closed (also referred to as on or in an on state), it provides a low ohmic connection between at least two of its load terminals, such that current may flow between the load terminals. When the switch is open (also referred to as off or in an off state), the power switch exhibits a blocking behavior between its load terminals, i.e. is high ohmic, such that essentially no current may flow between the load terminals (with the exception of undesired effects like leakage current etc., which may occur in real devices). For example, when used as a power switch, one load terminal may be coupled to a load, and another load terminal may be coupled to a supply voltage like a battery voltage, to selectively couple the load with the supply voltage via the power switch. A power switch selectively coupling a load with a positive supply voltage is also referred to as a high side switch, while a power switch coupling a load with a negative supply voltage or ground is also referred to as a low side switch.

In some embodiments, power switch devices and corresponding methods are provided in which a power switch device may be reliably turned on in the case of an inverse current condition.

In some embodiments, such a switch may be implemented using a field effect transistor (FET) like a MOS (metal oxide semiconductor) transistor. In this case, the load terminals correspond to source and drain terminals of the MOS transistor, and a control terminal used for opening and closing the switch corresponds to a gate terminal. In other embodiments, a switch may be implemented using a bipolar transistor. In such a case, load terminals correspond to emitter and collector terminals, and a control terminal used for opening enclosing the switch may correspond to a base terminal. In other embodiments, insulated gate bipolar transistors (IGBTs) may be used. In such a case, load terminals correspond to emitter and collector terminals, and a control terminal used for opening and closing the switch may correspond to a base terminal. In some a power switches, in addition to a control terminal used for opening enclosing the switch, and the above-mentioned load terminals, further terminals including control terminals may be provided for diagnosis functions.

In some embodiments, an inverse current condition may be detected in a switch device, and a node associated with a driver circuit controlling the switch device may be driven to a predetermined voltage, for example to a supply voltage, in response to the inverse current condition being detected. In some embodiments, this may ensure that the switch device may be reliably turned on (i.e. brought to a closed state) even in case of an inverse current condition.

Turning now to the figures, FIG. 1 is a simplified block diagram illustrating a switch device according to an embodiment.

The switch device of FIG. 1 comprises a switch 10. Switch 10 may for example be a transistor switch, for example a metal oxide semiconductor (MOS) transistor, but is not limited thereto. A first load terminal of switch 10 is coupled to a first terminal 11, and a second load terminal of switch 10 is coupled to a second terminal 12. In operation, for example first terminal 11 may be coupled to a supply voltage like a battery voltage, and second terminal 12 may be coupled to a load. By controlling a control terminal 13 of switch 10 via a switch driver 16, first and second terminals 11, 12 may be selectively electrically coupled to each other and decoupled from each other. In this way, for example a load may be selectively coupled to a supply voltage.

The switch device of FIG. 1 furthermore comprises an inverse current detector 15 coupled to first terminal 11 and second terminal 12. Inverse current detector 15 detects an inverse current detector condition. For example, an inverse current condition may be detected by inverse current detector 15 if a voltage at terminal 12 exceeds a voltage at terminal 11, for example a supply voltage coupled to terminal 11.

In case inverse current detector 15 detects an inverse current condition, it controls a voltage driver 14 to drive a node associated with switch driver 16 to a predetermined voltage. For example, voltage driver 14 in this case may couple a supply voltage also coupled to first terminal 11 with a node supplying switch driver 16. This node may be a node which otherwise would be pushed or pulled to a voltage at second terminal 12 and/or would be left floating. In this way, as will be explained later in more detail, in some embodiments it may be prevented that a parasitic bipolar transistor formed in some implementations of switch driver 16 becomes conducting, which in turn may enable switch driver 16 to turn switch 10 on even in case of an inverse current condition.

Figure 2:
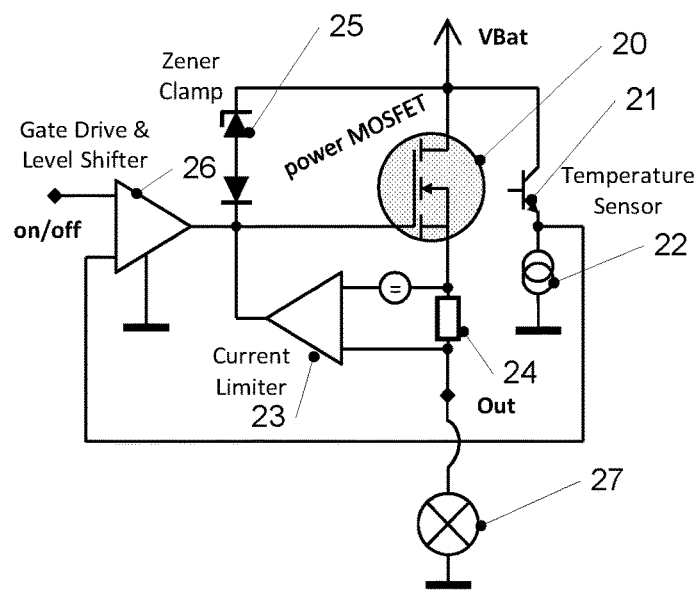
FIG. 2 illustrates a power switch device as an example environment where embodiments may be implemented.

Concepts using an inverse current detector as explained with respect to FIG. 1 may for example be incorporated into smart power switch devices. FIG. 2 illustrates a smart power switch device which serves as an example environment where techniques disclosed with reference to FIG. 1 or disclosed later with reference to FIGS. 3-9 may be implemented.

The power switch device of FIG. 2 comprises a MOSFET 20 acting as a power switch to selectively couple a supply voltage, in this case a battery voltage VBat, with a load. This load in case of FIG. 2 is represented by a light bulb 27, although other types of load may be used. Battery voltage VBat is an example for a supply voltage, for which an undervoltage may be detected as explained with reference to FIG. 1. A gate terminal of power MOSFET 20 is coupled to an output of a gate driver and level shifter 26. Via gate driver and level shifter 26, using an on-off signal the switch may be selectively turned on or off, wherein the on state as explained above corresponds to a state where power MOSFET 20 is closed and an off state corresponds to an open state. The on-off signal is an example for a signal on a control input connection like control input connection 13 of FIG. 1, which may be used to supply a memory element to store information regarding a detected undervoltage condition.

In the embodiment of FIG. 2, gate driver and level shifter 26 additionally receives a signal from a temperature sensor, which in the example of FIG. 2 is formed by a transistor 21 and a current source 22. Transistor 21 may be a bipolar transistor, pn junctions of which change their behavior with changing temperature. In other embodiments, any other conventional implementation of a temperature sensor may be used.

Furthermore, the power switch device of FIG. 2 comprises a current limiter 23. Current limiter 23 receives a measure of a current flowing via the load terminals of power MOSFET 20 by measuring a voltage drop across a sense resistor 24 and may control the gate terminal of power MOSFET 22 prevent an overcurrent. Other circuitry may also be provided, for example shunt resistors for current limitation. Furthermore, a Zener diode clamp 25 is provided as an overvoltage protection. It should be noted that the shown power switch devices serve only illustrative purposes, and in other power switch devices for example only some of the features or elements shown in FIG. 2 and/or alternative features or elements may be provided.

Figure 3A:
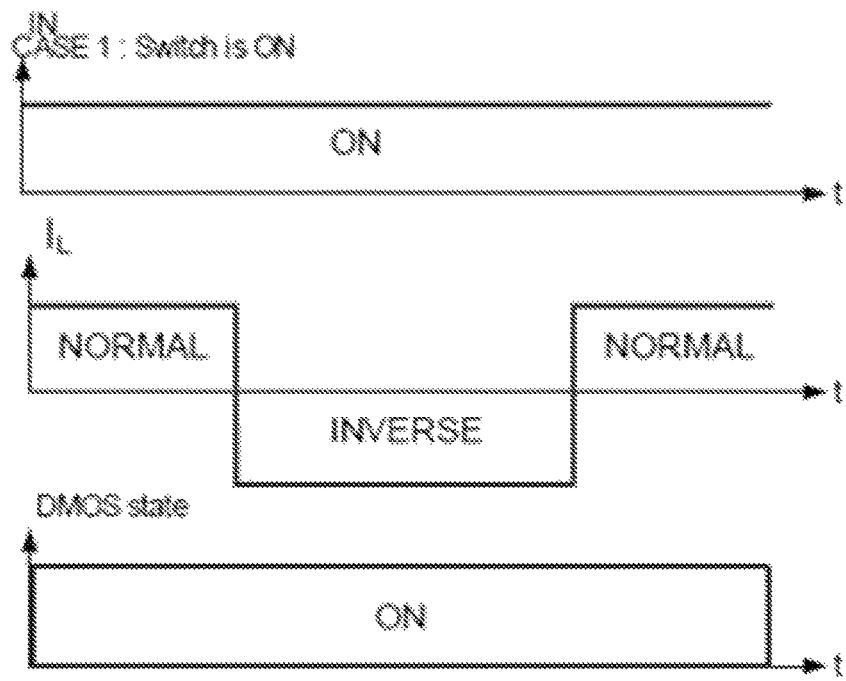
FIGS. 3A to 3D are explanatory diagrams illustrating various conditions of a power switch device.
Figure 3B:
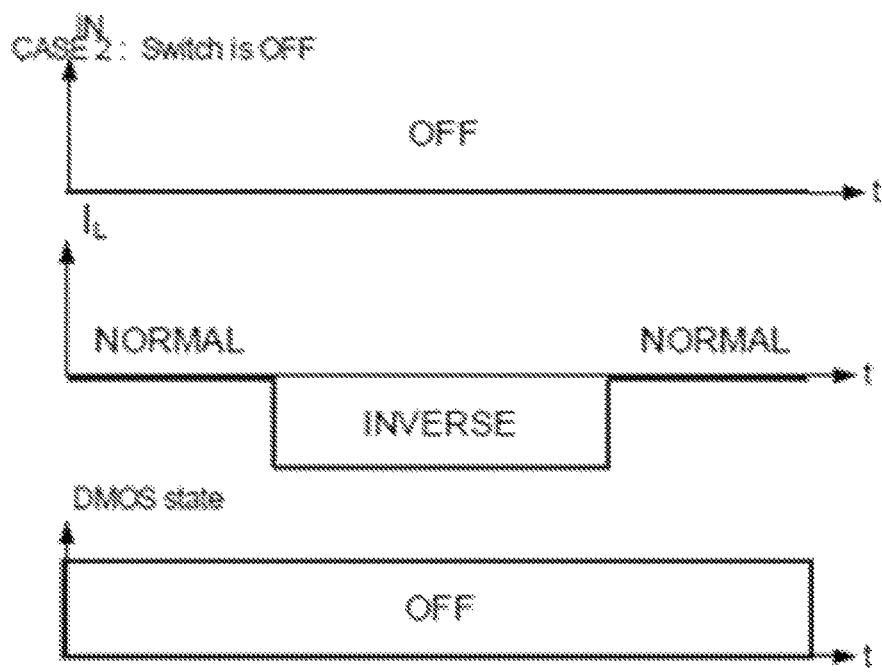
Figure 3C:
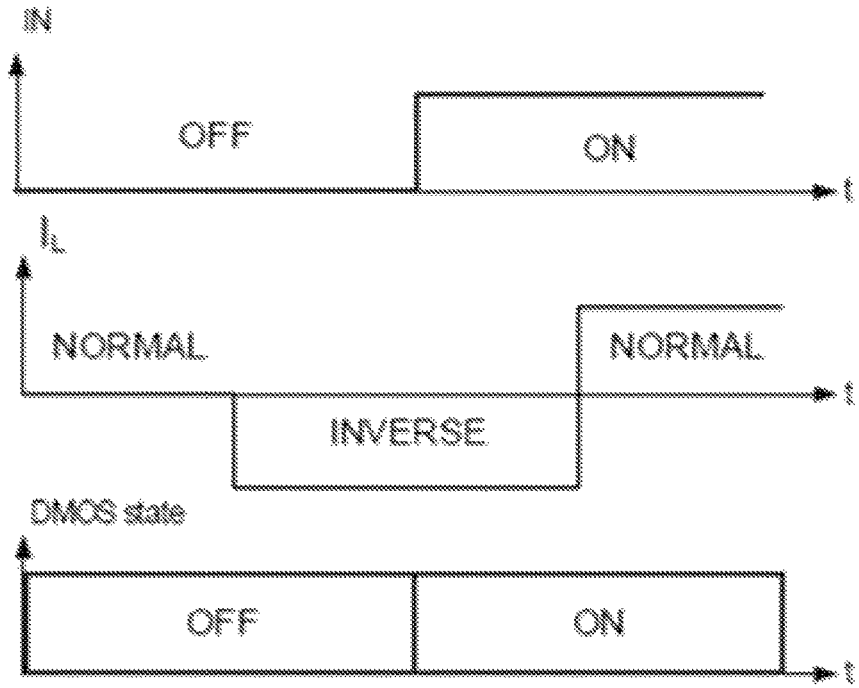
Figure 3D:
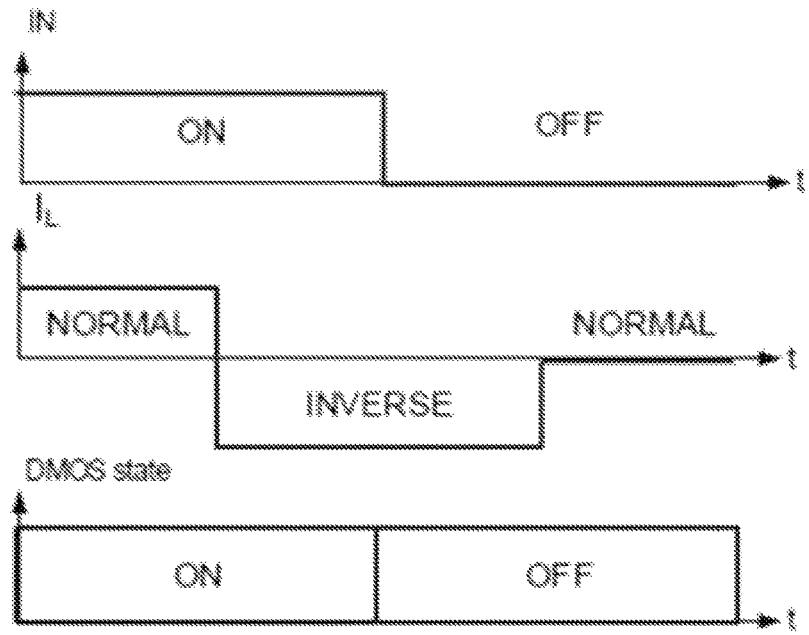
Figure 4:
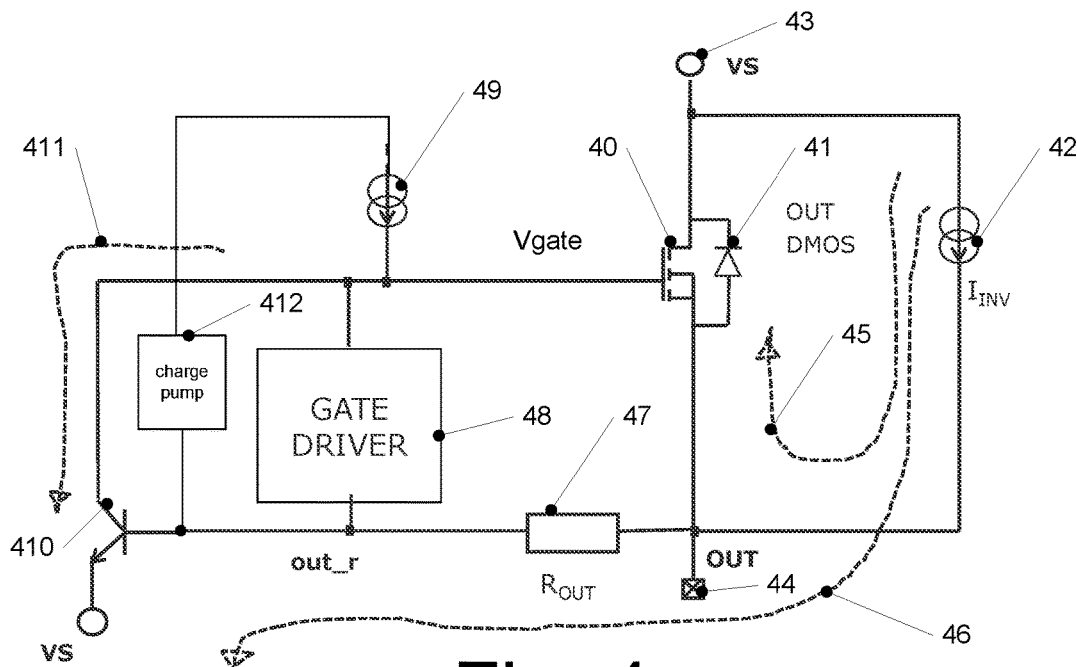
FIG. 4 is a diagram for illustrating effects of an inverse current condition.
Figure 5:
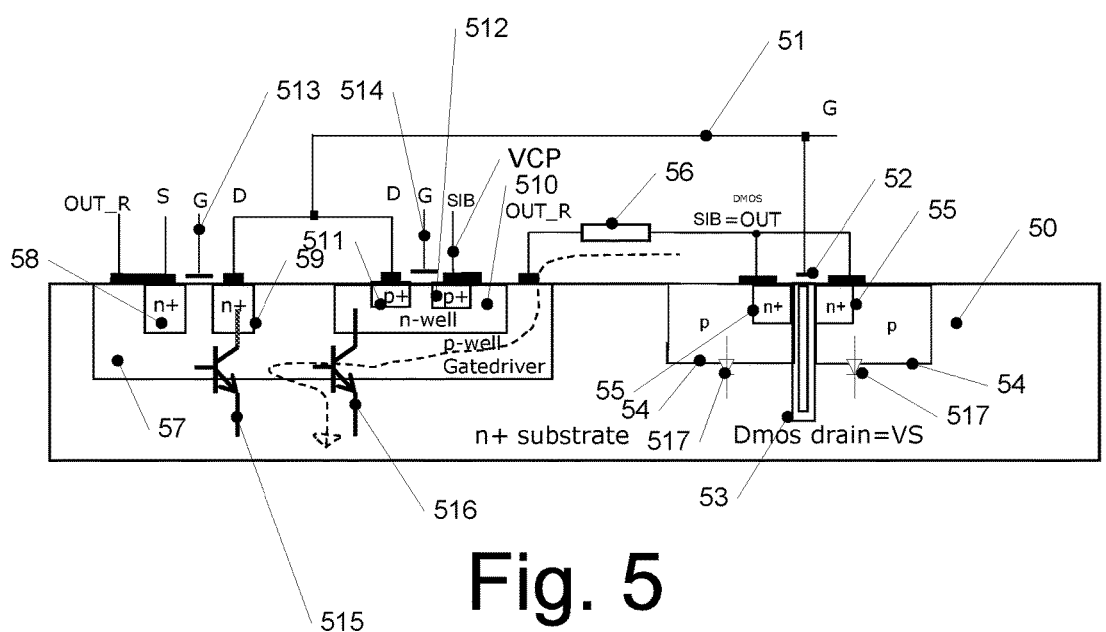
FIG. 5 is a cross-sectional view of a semiconductor structure for illustrating effects of an inverse current condition.

Inverse currents and problems associated therewith will now further be explained referring to FIGS. 3 to 5.

FIGS. 3A to 3D show various switching situations. Each of FIGS. 3A to 3D illustrates a particular switching situation and shows an example for a control signal IN controlling a switch, a current IL, and a state of the switch "DMOS state". A DMOS transistor (double diffused metal oxide semiconductor field effect transistor) is an example for a switch that may be used in some embodiments.

FIG. 3A illustrates a case where the control input IN is always at a level to turn the switch on, and the state of the switch correspondingly is always on. This on state remains irrespective of whether the current changes from a normal current to an inverse current or vice versa.

FIG. 3B illustrates a similar situation as does FIG. 3A, but with the control signal IN being at a voltage level indicating an off state, and the switch consequently being in an off state all the time. Also here, the off state remains irrespective of normal or inverse current.

FIG. 3C illustrates a case of particular interest for some of the embodiments discussed herein. Here, initially, the control signal IN indicates an off state, and after some time the switch is to be turned on. However, in the situation of FIG. 3C this switching from off to on occurs during an inverse current condition. Ideally, the switch should turn on, as indicated by the DMOS state. However, in some conventional solutions, this may not be reliably ensured due to parasitic transistor effects. Embodiments discussed herein, for example the embodiment of FIG. 1, by driving a node associated with a switch driver to a predetermined voltage may ensure that the switch is reliably turned on in such a situation.

FIG. 3D illustrates the reverse situation to FIG. 3C, where a switch is initially turned on by a corresponding control signal IN and then switched off during an inverse current condition. This case generally is less problematic than turning on the switch as shown in FIG. 3C.

FIG. 4 is a circuit diagram further illustrating the effect of an inverse current in a switch device. FIG. 4 illustrates a switch device using an MOS transistor 40, for example a DMOS transistor, as a switch.

Transistor 40 includes a body diode 41. Transistor 40 is provided to selectively couple a supply voltage VS at a terminal 43 to an output terminal 44, which for example in turn may be coupled with a load. A current source 42 symbolizes an external inverse current.

A gate driver 48 is coupled to a gate terminal of transistor 40 to control switching off transistor 40. A node out_r associated with gate driver 48 is coupled to output terminal 44 via a resistor 47. Numeral 49 indicates a current source illustrating a current provided from a charge pump circuit 412 to the gate terminal of transistor 40. The inverse current is also indicated by an arrow 45 in FIG. 4. Just to give a numerical example, in the inverse current condition of FIG. 4, VS may be 13.5 Volt, and a voltage at the output terminal 44 may be 14.5 Volt, resulting in a voltage at OUT_R also of 14.5 Volt.

Numeral 410 illustrates a parasitic transistor which is formed by semiconductor structures implementing gate driver 48 in some examples, as will be explained later in more detail referring to FIG. 5.

In an inverse current condition, as indicated by a dashed arrow 46 via resistor 47 parasitic transistor 410 is triggered, i.e. turned on. This, as indicated by an arrow 411, pulls the gate voltage Vgate down to VS potential (parasitic transistor 410 is in saturation: VCEsat<=0.1 V). In a normal ON condition of the power transistor 40, the gate voltage Vgate is defined by the output voltage of the charge pump. In that case, the charge pump potential is always much higher than VS (maximum allowed Vgs voltage of power transistor 40 is defined by technology, e.g.: 3.6 V; the VCHP=3.6 V). However, as the voltage at OUT is greater than VS in an inverse current condition, this means that transistor 40 cannot be turned on in such a case because the parasitic bipolar transistor 410 is activated and the Gate-Source-Voltage of power transistor 40 is near to 0 V.

The presence of a parasitic bipolar transistor like 410 may be better understood referring to FIG. 5, which illustrates a cross-sectional view of an example semiconductor structure implementing a switch device. The semiconductor structure of FIG. 5 is formed in an n+ substrate 50. A DMOS transistor as a switch is formed by a p-body region 54 with an n+ contact region 55, a gate electrode 52 providing a channel 53 to drain. Numerals 517 denote body diodes formed by the DMOS transistor structure shown in FIG. 5. Gate driver structures are formed in a p-well 57 formed in n+ substrate 50. In particular, the gate driver structure comprises an NMOS transistor controlled by a gate terminal 513 and a PMOS transistor controlled by a gate terminal 514. A source terminal (also labeled S) of the NMOS transistor is formed by an n+ doped region 58, which is coupled to node OUT_R as indicated in FIG. 5. A drain terminal (also labeled D) is formed by an n+ region 59. The PMOS transistor is formed by p+ regions 511 (serving as drain) and p+ regions 512 (serving as source) formed in an n-well 510. n-well 510 is also coupled to node OUT_R, which is coupled to the output of the DMOS via resistor 56. Resistor 56 corresponds to resistor 47 of FIG. 4. The drain terminals of the NMOS and PMOS transistors discussed above are coupled to the gate terminal of the DMOS via a connection 51, as shown. By controlling the gates 513, 514, accordingly, either the source of the NMOS transistor or the source of the PMOS transistor may be coupled to the gate, which may be used to open and close the DMOS transistor.

As can be seen, parasitic bipolar transistors 515, 516 are formed. In the example structure of FIG. 5, parasitic bipolar transistor 515 is formed by n+ region 59, p-well 57 and n+ substrate 50, and parasitic bipolar transistor 516 is formed by n-well 510, p-well 57 and n+ substrate 50. Such parasitic bipolar transistors may correspond to parasitic bipolar transistor 410 of FIG. 4 and may lead to the behavior as discussed above.

Figure 6:
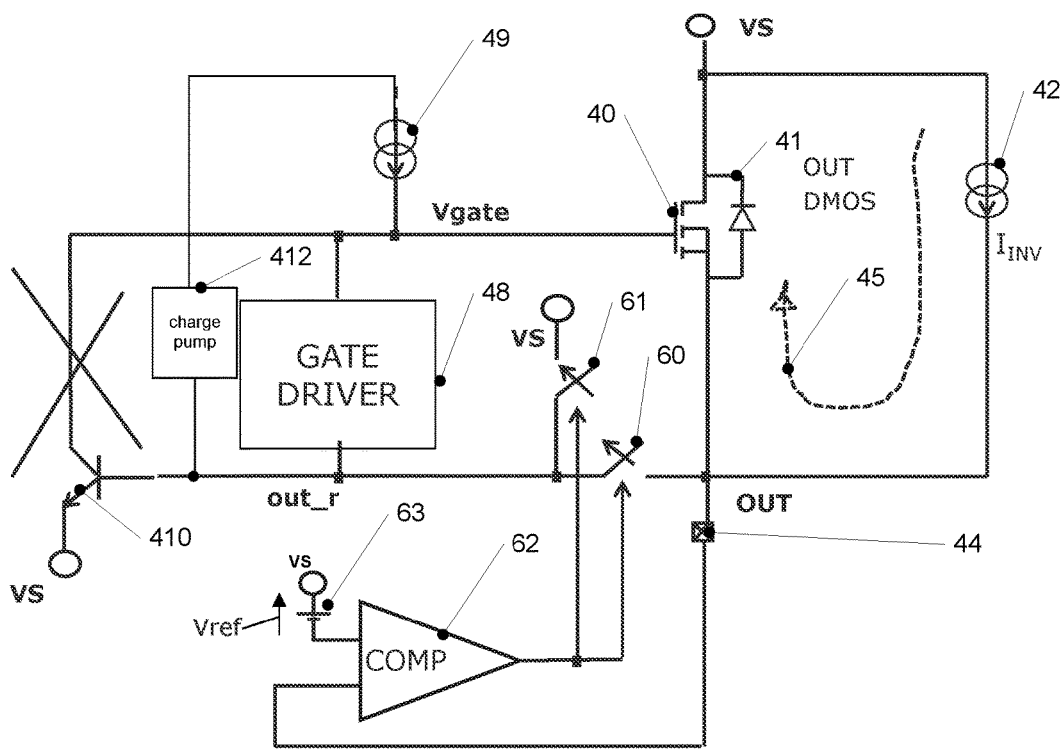
FIG. 6 is a circuit diagram illustrating a switch device according to an embodiment.

FIG. 6 illustrates a switch device according to an embodiment, which is based on the switch device already explained referring to FIG. 4. In order to avoid repetitions, in FIG. 6 elements which have already been described referring to FIG. 4 bear the same reference numerals and will not be discussed again in detail.

In addition to the elements discussed referring to FIG. 4, the embodiment of FIG. 6 comprises an inverse current detector which is formed by a comparator 62 comparing a voltage at output terminal 44 to a voltage derived for example from VS via an additional voltage offset element 63, which may provide some margin, e.g. between −20 and −50 Millivolt, for example of the order of −40 Millivolt (in other words, the voltage at terminal 44 may be compared to VS plus the margin, to avoid activation of the mechanism at very slight inverse current conditions/inverse voltage conditions or at a difference of 0V caused by an off condition). In other embodiments, instead of or in addition to voltage offset element 63, comparator 63 may have an offset, e.g. between −20 and −50 mV, for example of the order of −40 Millivolt, to provide such a margin. Comparator 62 controls two switches 60, 61. In normal operation, i.e. when no inverse current condition is detected, switch 60 is closed and switch 61 is opened, resulting in normal operation of the switch device. However, when an inverse current condition is detected, switch 60 is opened, which decouples terminal 44 from node out_r. The comparator 62, in some embodiments, may include a small hysteresis for example in the range of about 10 mV in order to avoid a toggling of the detection of the inverse current condition. Furthermore, switch 61 is closed, thus driving node out_r to VS. This prevents turning on parasitic bipolar transistor 410 and thus prevents the voltage Vgate from being drawn to the voltage at the output terminal 44. Therefore, transistor 40 can still reliably be turned on even in an inverse current condition in the embodiment of FIG. 6.

Figure 7:
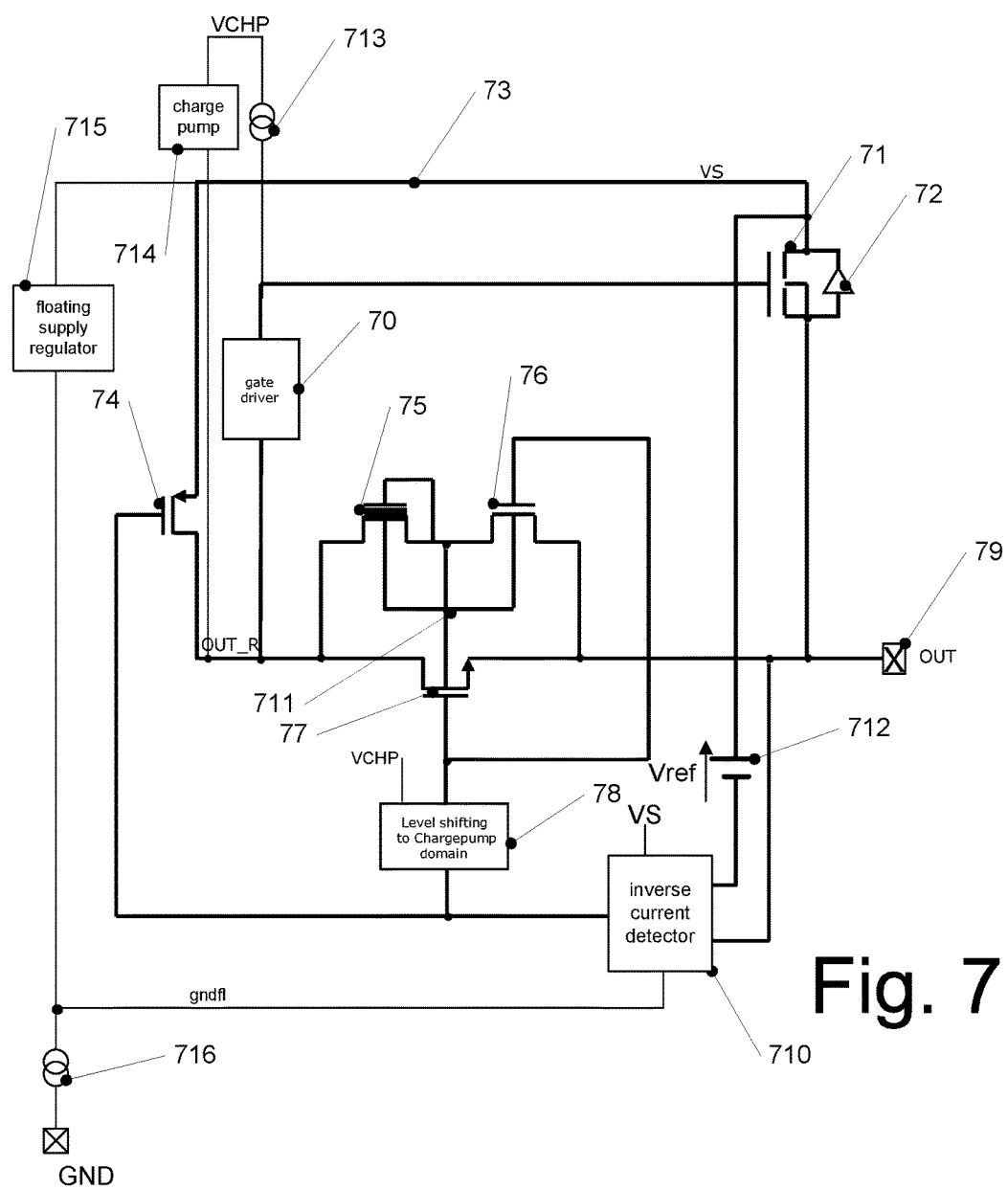
FIG. 7 is a circuit diagram illustrating a switch device according to a further embodiment.

FIG. 7 illustrates a further embodiment of a switch device.

The switch device of FIG. 7 comprises a switch transistor 71, which may for example be a MOSFET transistor like a DMOS, which comprises a body diode 72. Switch transistor 71 is controlled by a gate driver 70 to selectively couple a supply voltage VS at 73 to an output 79. To this end, gate driver 70 is coupled between a gate terminal of switch transistor 71 and a node OUT_R.

Node OUT_R is coupled to output terminal 79 via a first switch 77 implemented by an NMOS transistor (which may e.g. correspond to FIG. 6, switch 60). Furthermore, node OUT_R is coupled to supply voltage 73 via a second switch 74 implemented by a PMOS transistor (which may e.g. correspond to FIG. 6, switch 61).

To detect an inverse current condition, the switch device of FIG. 7 comprises a comparator 710. A first input of comparator 710 is coupled to the source terminal of switch transistor 71 as illustrated in FIG. 7. A second input of comparator 710 is coupled to a reference potential, which is generated by the supply voltage VS 73 plus a margin Vref 712. An output of comparator 710 controls second switch 74 and, via a level shifter 78, first switch 77. Comparator 710 is supplied by VS and a floating supply line gndfl which is generated by a floating supply regulator 715. The comparator output may in the embodiment of FIG. 7 drive directly PMOS transistor 74. The functioning of comparator 710 and first and second switches 77, 74 essentially corresponds to the function of comparator 62 and switches 60, 61 in FIG. 6. In particular, in the embodiment of FIG. 7, in normal operation when no inverse current condition is detected by comparator 710, switch 77 is closed (turned on), and switch 74 is open (turned off). When an inverse current detection is detected, i.e. a voltage at output terminal 79 is higher than voltage VS at 73 plus margin Vref 712, switch 77 is opened, thus decoupling node OUT_R from output terminal 79, and second switch 74 is closed, thus coupling node OUT_R to the supply voltage at 73 and driving OUT_R to VS. As explained previously, in embodiments this may ensure that switch transistor 71 may be turned on even in case of an inverse current condition.

Furthermore, the switch device of FIG. 7 comprises a depletion transistor 75 and a third switch 76 implemented as MOS transistors. Depletion transistor 75 and third switch 76 as well as first switch 77 have bulk terminals coupled to a bulk node 711. Via depletion transistor 75 and third switch 76, bulk node 711 is selectively either coupled to output terminal 79 or to OUT_R. In particular, in case of an inverse current condition depletion transistor 75 which works like a current source (e.g. providing a current of about 5 μA) pulls the common bulk to OUT_R potential and fourth switch 76 is turned off, while in normal operating condition (no inverse current), third switch 76 is turned on and overdrives the current coming from depletion transistor 75. In some implementations, this may further contribute to a correct switching behavior of first switch 77, although in other embodiments depletion transistor 75 and third switches 76 may be omitted (as shown for example in FIG. 6).

Instead of the depletion transistor 75 a general current source or a high ohmic resistor (e.g. resistance value of 100 kOhm or more) may be used in other embodiments. These elements (including depletion transistor 75) may also be referred to as current source elements, as they act like a current source.

Figure 8:
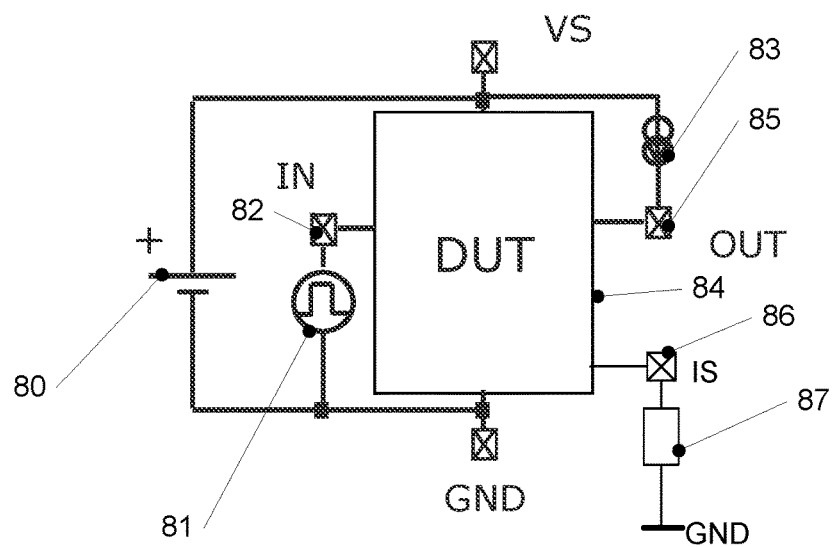
FIG. 8 is a diagram illustrating a test setup for switch devices.
Figure 9:
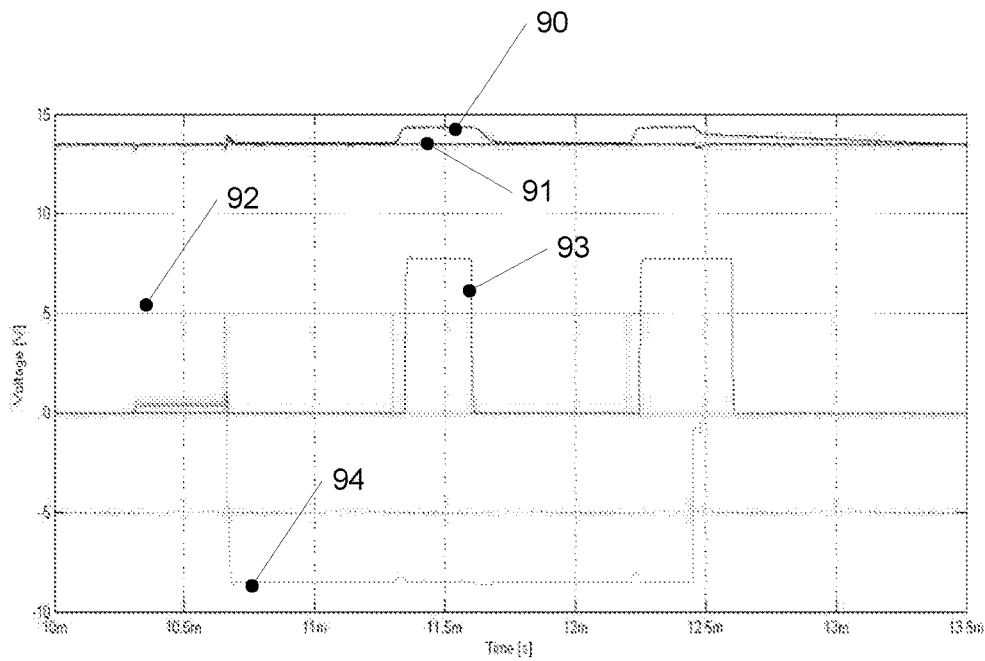
FIG. 9 is a diagram illustrating test results for a particular implementation of a switch device.

FIGS. 8 and 9 illustrate testing and test results of a device similar to the device of the embodiment of FIG. 7. FIG. 8 illustrates a circuit diagram of a test system for testing a device under test (DUT) 84, in particular a switch device as illustrated previously. The test system of FIG. 8 comprises a voltage supply 80 to provide a supply voltage VS to device under test 84, which may for example correspond to supply voltage VS at 73 in FIG. 7. Moreover, the test system comprises a control signal generator 81 to generate a control signal for switching device under test 84, which is supplied to input terminal 82. This corresponds to an input signal supplied to gate driver like gate driver 70 of FIG. 7, for example a signal controlling transistors of gate drivers, for example at gate terminals 513, 514 shown in FIG. 5. Finally, the test system of FIG. 8 comprises an inverse current generator 83 to induce an inverse current condition between an output terminal 85 and the supply voltage VS. With this system, device under test 84 may be tested under various switching states and normal or inverse current conditions. For the example, the situations illustrated in FIGS. 3A through 3D may be evaluated using such a test system.

FIG. 9 illustrates test results for an example implementation similar to the implementation of FIG. 7. In FIG. 9, various curves illustrating voltages and currents over time are shown.

A curve 91 illustrates a supply voltage VS. A curve 92 illustrates a control voltage used for controlling the switch, which, as shown, changes between on and off states. A curve 94 illustrates a current condition, negative values indicating an inverse current condition. A curve 90 illustrates an output voltage. A curve 93 illustrates a voltage at an additional diagnosis output, which may be provided in some implementations. A curve 90 illustrates the voltage at node OUT.

As can be seen, in the situation shown in FIG. 9, at the beginning (time=10 ms) the control voltage 92 is high which turns the switch on. At a time of about 11.3 ms control voltage changes to low, which turns off the switch. An output voltage 90 at this time is then higher than a supply voltage VS (curve 91) which corresponds to an inverse current condition. At a time of about 11.6 s, control signal 92 changes to high again, turning the switch on again. The fact that the output voltage 90 goes back down to curve 91 (supply voltage) shows that the switch indeed has been turned on during inverse condition, i.e. the techniques employed in this particular implementation enabling turning on the switch even in an inverse current condition. At a time of approximately 12.2 ms, control signal 92 changes back to low, turning the switch off again.

Figure 10:
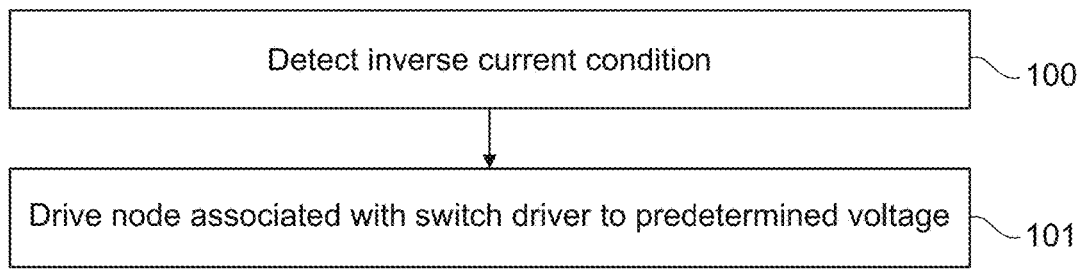
FIG. 10 is a flow chart illustrating a method according to an embodiment.

FIG. 10 is a flow chart illustrating a method according to an embodiment. The method of FIG. 10 may be implemented in the switch devices and systems discussed previously referring to FIGS. 1 to 9, but is not limited thereto. Nevertheless, for ease of illustration, when describing the method of FIG. 10, reference will be made to FIGS. 1 to 9.

At 100, the method of FIG. 10 comprises detecting an inverse current condition at a switch. For example, for this detecting, one or both load terminals of the switch may be coupled to inputs of a comparator, as illustrated in FIG. 6 and FIG. 7. At 101, the method comprises driving a node associated with a switch driver driving the switch to a predetermined voltage in case an inverse current condition was detected at 100. For example, the switch driver may be coupled between the node and a control input of the switch, as shown in FIGS. 6 and 7. Driving the node in particular implementations may comprise coupling the node the predetermined voltage, for example a supply voltage, by closing a switch. Furthermore, in addition, as illustrated in FIGS. 6 to 7, the node may be decoupled from an output terminal of the switch (for example by opening switch 60 of FIG. 6 or switch 77 of FIG. 7).

Figure 11:
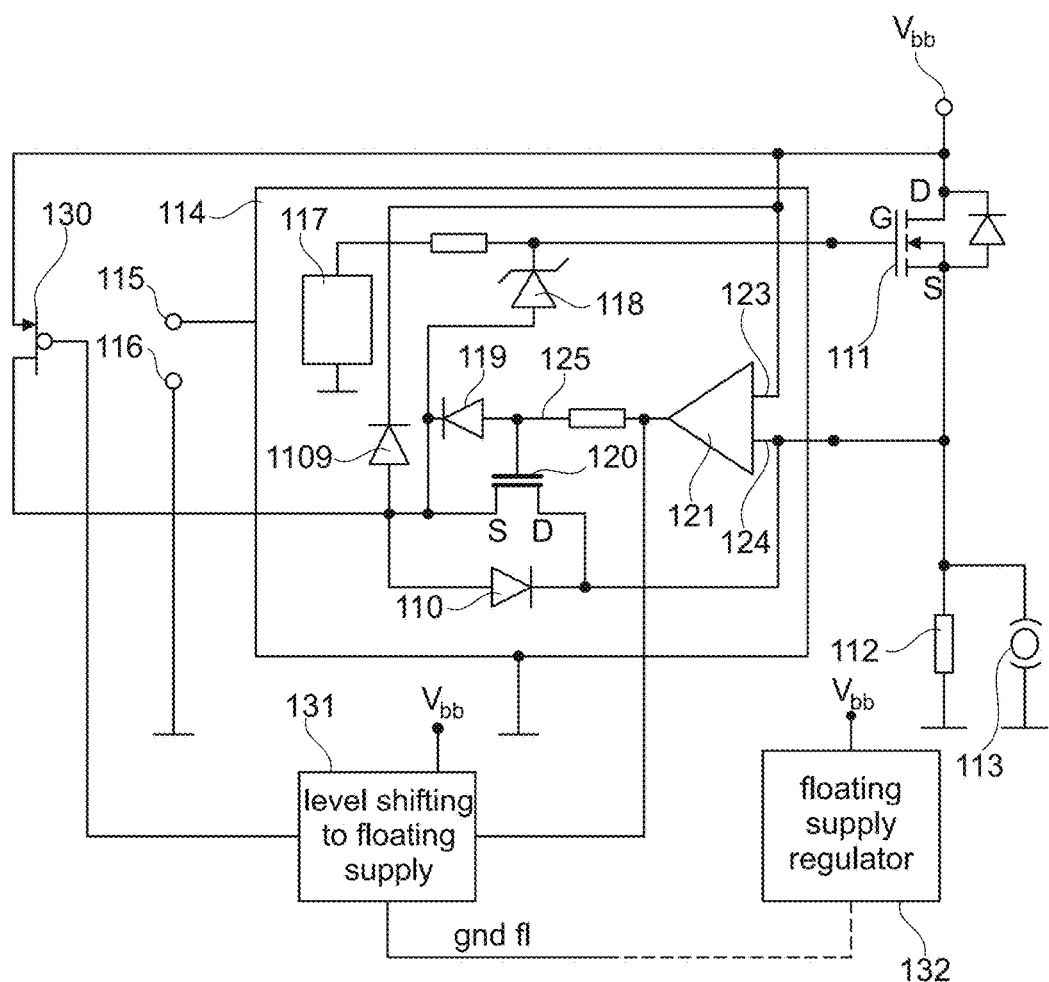
FIG. 11 is a circuit diagram illustrating a switch device according to a further embodiment.

FIG. 11 is a circuit diagram of a switch device illustrating a further embodiment. The circuit of FIG. 11 comprises a power MOSFET (metal-oxide-semiconductor field effect transistor) 111 having a body diode as a switch to selectively couple a load 112 to a supply voltage Vbb. Numeral 113 denotes a generator which may induce an inverse current condition at MOSFET 111.

A gate terminal of MOSFET 111 is controlled by a charge pump 117. Charge pump 117 is part of an integrated control circuit 114 for controlling MOSFET 111. Control circuit 114 further comprises a comparator 121, input terminals 123, 124 of which are coupled to Vbb and a source terminal of MOSFET 111, respectively, to detect an inverse current condition. An output of comparator 121 at node 125 controls a first NMOS switch 120 (depletion field effect transistor), the function of which corresponds to first switch 60 of FIG. 6. Furthermore, via a level shifter 131 which shifts the comparator output to a floating supply domain, the output of comparator 121 controls a PMOS switch 130, the function of which corresponds to second switch 61 of FIG. 6. Level shifter 131 is supplied with a voltage gndfl by a floating supply regulator 132.

The circuit of FIG. 11 further comprises a parasitic diode 1109, which may be formed in a semiconductor structure implementing the circuit of FIG. 11. A further diode no is provided in an anti-series connection to diode 1109. This may prevent a current flow through diode 1109 in case of an inverse current condition. A diode 119 serves for setting an operating point of NMOS switch 120. Numeral 118 denotes a protection diode.

It should be noted that in the switch devices discussed above, various elements may be monolithically integrated together on a single chip die. For example, the inverse current detection together with first and second switches (e.g. 60, 61 of FIG. 6) may be monolithically integrated together with the switch transistor itself (and possibly other elements, e.g. as shown in FIG. 2). In other implementations, one or more components may be provided separately from the switch itself.

Furthermore, at least some of the switches discussed above are configured and used as high side switches, where a first load terminal (e.g. drain terminal) of a switch is coupled to a supply voltage and a second load terminal (e.g. source terminal) of the switch is coupled to a load. An inverse current condition may then be detected based on the supply voltage and a voltage at the second load terminal, e.g. by using a comparator as discussed. In applications of switch devices other than high side switches, an inverse current condition may be detected based on a voltage at the first load terminal (which in case of high side switches corresponds to the supply voltage) and a voltage at the second load terminal. This may be done e.g. by using a comparator, possibly together with a voltage offset element, in essentially the same manner as discussed above, only by replacing the supply voltage with the voltage at the first load terminal.

As can be seen from the above discussions of modifications and variations, the embodiments shown serve only as examples and are not to be construed as limiting.

According to some embodiments, the following examples are provided:

Example 1

A switch device, comprising: a switch (10; 20; 40; 71) comprising a control terminal, a first load terminal and a second load terminal, a switch driver (16; 26; 48; 70) coupled to the control terminal of the switch (10; 20; 40; 71), an inverse current detector (15; 62; 710) configured to detect an inverse current condition at the first and second load terminals of the switch, and a voltage driver (14; 60, 61; 74, 77) configured to drive a node (OUT_R) associated with the switch driver (16; 26; 48; 70) to a predetermined voltage in response to the inverse current detector (15; 62; 710) detecting an inverse current condition.

Example 2

The switch device of example 1, wherein the switch driver (16; 26; 48; 70) is coupled between the node (OUT_R) and the control terminal of the switch (10; 20; 40; 71).

Example 3

The switch device of example 1, wherein the inverse current detector (15; 62; 710) comprises a comparator (62, 710).

Example 4

The switch device of example 3, wherein the first load terminal of the switch is configured to be coupled to a supply voltage terminal, wherein a first input terminal of the comparator (710) is coupled to the second load terminal of the switch (71), and wherein a second input terminal of the comparator (710) is coupled to the supply voltage terminal.

Example 5

The switch device of example 4, wherein the comparator has an offset.

Example 6

The switch device of example 4, further comprising a voltage offset element (63) coupled between the second input terminal of the comparator (62) and the supply voltage terminal.

Example 7

The switch device of example 1, wherein the voltage driver comprises a first switch (61; 74) configured to couple the node to the predetermined voltage in case the inverse current detector (15; 62; 710) detects an inverse current condition.

Example 8

The switch device of example 7, wherein the voltage driver further comprises a second switch (60; 77) configured to decouple the node (OUT_R) from the second load terminal of the switch (10; 20; 40; 71) in case the inverse current detector (15; 62; 710) detects an inverse current condition.

Example 9

The switch device of example 8, further comprising a current source element (75) coupled between a bulk terminal of the second switch and the node (OUT_R) and a third switch (76) coupled between the bulk terminal of the second switch (77) and the second load terminal of the switch (70).

Example 10

The switch device of example 9, wherein at least one of the current source element (75) and the third switch (76) is configured to be controlled by the inverse current detector (710).

Example 11

The switch device of example 9, wherein the current source element comprises at least one of a depletion transistor (75), a current source and a resistor.

Example 12

The switch device of example 11, wherein the first load terminal of the switch (10; 20; 40; 71) is configured to be coupled to a supply voltage (VS), and the second load terminal of the switch (10; 20; 40; 71) is configured to be coupled to a load (27).

Example 13

The switch device of example 12, wherein the predetermined voltage is the supply voltage.

Example 14

The switch device of example 1, wherein the switch driver (16; 26; 48; 70) comprises a semiconductor structure including a parasitic bipolar transistor (515; 516), the voltage driver (14; 60, 61; 74, 77) being configured to prevent the parasitic bipolar transistor (515, 516) from drawing the node to a potential preventing a closing of the switch (10; 20; 40; 71) during an inverse current condition.

Example 15

A method, comprising: detecting an inverse current condition at a switch (10; 20; 40; 71), and driving a node associated with a switch driver (16; 26; 48; 70) driving the switch to a predetermined voltage in response to the detection of an inverse current condition at the switch.

Example 16

The method of example 15, wherein driving the node comprises coupling the node to a supply voltage.

Example 17

The method of example 15, wherein driving the node further comprises decoupling the node from a second load terminal of the switch, the second load terminal being coupled to a load.

Example 18

The method of example 17, further comprising selectively coupling a bulk terminal of a switch (75, 76) for decoupling the node from the second load terminal of the switch to the node or to the second load terminal responsive to the detection of an inverse current condition.

Example 19

The method of example 15, wherein a first load terminal of the switch (10; 20; 40; 71) is coupled to a supply voltage, wherein the predetermined voltage corresponds to the supply voltage.

Example 20

The method of example 15, wherein detecting the inverse current condition comprises comparing a voltage at the second load terminal of the switch to at least one of a supply voltage and a voltage at the first load terminal of the switch.

What is claimed is:
1. A switch device, comprising:
    a switch driver configured to be coupled to a control terminal of a switch,
    an inverse current detector configured to detect an inverse current at a first load terminal and a second load terminal of the switch, and
    a voltage driver configured to drive a node associated with the switch driver to a predetermined voltage in response to the inverse current detector detecting the inverse current, wherein the predetermined voltage is configured to turn-on the switch.
2. The switch device of claim 1, wherein the switch driver is coupled between the node and the control terminal of the switch.
3. The switch device of claim 1, wherein the inverse current detector comprises a comparator.
4. The switch device of claim 3, wherein the first load terminal of the switch is configured to be coupled to a supply voltage terminal, wherein a first input terminal of the comparator is coupled to the second load terminal of the switch, and wherein a second input terminal of the comparator is coupled to the supply voltage terminal.
5. The switch device of claim 4, wherein the comparator has an offset.
6. The switch device of claim 4, further comprising a voltage offset element coupled between the second input terminal of the comparator and the supply voltage terminal.
7. The switch device of claim 1, wherein the voltage driver comprises a first switch configured to couple the node to the predetermined voltage in case the inverse current detector detects the inverse current.

8. The switch device of claim 7, wherein the voltage driver further comprises a second switch configured to decouple the node from the second load terminal of the switch in case the inverse current detector detects the inverse current.

9. The switch device of claim 8, further comprising:
a current source element coupled between a bulk terminal of the second switch and the node,
and a third switch coupled between the bulk terminal of the second switch and the second load terminal of the switch.

10. The switch device of claim 9, wherein at least one of the current source element or the third switch is configured to be controlled by the inverse current detector.

11. The switch device of claim 9, wherein the current source element comprises at least one of a depletion transistor, a current source or a resistor.

12. The switch device of claim 1, wherein the first load terminal of the switch is configured to be coupled to a supply voltage, and the second load terminal of the switch is configured to be coupled to a load.

13. The switch device of claim 12, wherein the predetermined voltage is the supply voltage.

14. The switch device of claim 1, wherein the switch driver comprises a semiconductor structure including a parasitic bipolar transistor, the voltage driver being configured to prevent the parasitic bipolar transistor from drawing the node to a potential preventing a closing of the switch when the inverse current is detected at the first load terminal and the second load terminal of the switch.

15. The switch device of claim 1, further comprising the switch.

16. A method, comprising:
detecting an inverse current at a switch, and
turning on the switch in response to detecting the inverse current, wherein turning on the switch comprises driving a node associated with a switch driver driving the switch to a predetermined voltage.

17. The method of claim 16, wherein driving the node comprises coupling the node to a supply voltage.

18. The method of claim 17, wherein driving the node further comprises decoupling the node from a second load terminal of the switch, the second load terminal being coupled to a load.

19. The method of claim 18, further comprising selectively coupling a bulk terminal of a further switch to the node or to the second load terminal dependent on the detecting the inverse current, wherein a load path of the further switch is coupled between the node and the second load terminal of the switch.

20. The method of claim 18, wherein a first load terminal of the switch is coupled to the supply voltage, and wherein the predetermined voltage corresponds to the supply voltage.

21. The method of claim 20, wherein detecting the inverse current comprises comparing a voltage at the second load terminal of the switch to at least one of the supply voltage or a voltage at the first load terminal of the switch.

22. A switch control circuit, comprising:
a driver having an output terminal configured to be coupled to a control terminal of a switching transistor;
a first switch having a first terminal coupled to a reference terminal of the driver and a second terminal configured to be coupled to a first load terminal of the switching transistor;
a second switch coupled between a power supply terminal and the reference terminal of the driver; and
an inverse current detector having an output coupled to control terminals of the first switch and the second switch, and an input configured to be coupled to the switching transistor, wherein the inverse current detector is configured to detect an inverse current condition of the switching transistor, open the first switch and close the second switch when the inverse current condition is detected, and close the first switch and open the second switch when the inverse current condition is not detected.

23. The switch control circuit of claim 22, wherein the inverse current detector comprises a comparator having a first input configured to be coupled to the reference terminal of the driver and a second input configured to be coupled to a second load terminal of the switching transistor.

24. The switch control circuit of claim 23, further comprising a level shifter coupled between an output of the comparator and the control terminal of the first switch.

* * * * *